(12) United States Patent
Wilhelmsson et al.

(10) Patent No.: US 10,044,388 B2
(45) Date of Patent: Aug. 7, 2018

(54) CHANNEL SELECTION FILTER COMPENSATION

(71) Applicant: Telefonaktiebolaget LM Ericsson (publ), Stockholm (SE)

(72) Inventors: Leif Wilhelmsson, Dalby (SE);
Dzevdan Kapetanovic, Lund (SE);
Michal Stala, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 15/552,346

(22) PCT Filed: Mar. 3, 2015

(86) PCT No.: PCT/EP2015/054381
§ 371 (c)(1),
(2) Date: Aug. 21, 2017

(87) PCT Pub. No.: WO2016/138936
PCT Pub. Date: Sep. 9, 2016

(65) Prior Publication Data
US 2018/0026665 A1 Jan. 25, 2018

(51) Int. Cl.
*H04B 1/10* (2006.01)
*H03H 2/00* (2006.01)

(52) U.S. Cl.
CPC .......... *H04B 1/1036* (2013.01); *H03H 2/008* (2013.01); *H04B 2001/1045* (2013.01)

(58) Field of Classification Search
CPC .......... H04B 1/1036; H04B 2001/1045; H03H 2/008
(Continued)

(56) References Cited

U.S. PATENT DOCUMENTS 6,047,171 A    4/2000   Khayrallah et al.
7,885,624 B2   2/2011   Busking
(Continued)

FOREIGN PATENT DOCUMENTS

EP    2061153 A1   5/2009
EP    2083517 A1   7/2009
(Continued)

*Primary Examiner* — Dhaval Patel
(74) *Attorney, Agent, or Firm* — Coats & Bennett, PLLC

(57) ABSTRACT

A method is disclosed of a communication device adapted to process a received signal using either of a first channel selection filter and a second channel selection filter, where the received signal comprises signal entities each representing an individually processed block of data. The method comprises (during use of the first channel selection filter) detecting a presence of an interference signal outside a pass band of the first channel selection filter and switching to use of the second channel selection filter in response to detecting the presence of the interference signal. The method also comprises (if the switching occurs at a first point in time within a first signal entity dividing the first signal entity into a first part and a second part) applying a time domain compensation filter to one of the first part and the second part of the first signal entity. Corresponding computer program product, receiver arrangement and communication device are also disclosed.

24 Claims, 5 Drawing Sheets

(58) Field of Classification Search
USPC ........ 375/229, 227, 260, 295, 316, 265, 267
See application file for complete search history.

(56) References Cited

U.S. PATENT DOCUMENTS

| | | | |
|---|---|---|---|
| 8,243,864 B2* | 8/2012 | Ciccarelli | H03G 3/3052 375/346 |
| 2005/0147192 A1* | 7/2005 | Yamamoto | H03G 3/3052 375/345 |
| 2009/0098828 A1* | 4/2009 | Furman | H04B 1/1027 455/63.1 |
| 2013/0252567 A1 | 9/2013 | Pera et al. | |

FOREIGN PATENT DOCUMENTS

| | | | |
|---|---|---|---|
| JP | H05304485 A | 11/1993 | |
| JP | WO2014024278 A1 | 7/2016 | |
| WO | 2014024278 A1 | 2/2014 | |

* cited by examiner

CHANNEL SELECTION FILTER COMPENSATION

TECHNICAL FIELD

The present invention relates generally to the field of wireless communication receivers. More particularly, it relates to application of channel selection filters in wireless communication receivers.

BACKGROUND

Channel selection filters are commonly applied in wireless communication receivers. One purpose of the application of a channel selection filter (CSF) is to achieve a final analog filtering before analog-to-digital conversion (ADC), to suppress any unwanted components of the received signal (e.g. adjacent channel interference) that remain after the previous processing by the receiver front end.

A CSF is often realized as an Infinite Impulse Response (IIR) filter, typically a Chebyshev filter of a certain filter order. A high filter order may typically achieve better suppression of undesired signal components outside of the pass band of the filter than a low filter order. However, a high filter order typically also increases cost, complexity and/or power consumption of the filter.

An example group of scenarios where the CSF implementation may be of particular importance is when an interference signal (also referred to herein as a blocker, an unwanted signal, an undesired signal, etc.) is present close to the frequency band of the desired signal, which frequency band typically corresponds to the pass band of the CSF. To be able to sufficiently suppress this type of interference signal it may be necessary to apply a CSF of high filter order.

In some of these scenarios, such an interference signal may not be continuously present, but may appear and disappear depending on various conditions (e.g. radio environment). Thus, to reduce the power consumption, two (sets of) channel selection filters may be used, one with high filter order to be applied when the interference signal is present (or otherwise in radio conditions that require high suppression outside the pass band) and one with low filter order to be applied otherwise (e.g. when the interference signal is not present). The channel selection filter with low filter order may be seen as a default channel selection filter.

However, since the digital processing of the received signal is typically designed for a particular CSF design, a problem will occur when switching between two different CSF designs is applied. Particularly, data may be corrupted during and/or after the switch.

Therefore, there is a need for methods and arrangements of wireless communication receivers that enable use of two (or more) different channel selection filters, and switching there between, while avoiding (or at least reducing) negative impact on the overall performance of the receiver.

SUMMARY

It should be emphasized that the term "comprises/comprising" when used in this specification is taken to specify the presence of stated features, integers, steps, or components, but does not preclude the presence or addition of one or more other features, integers, steps, components, or groups thereof.

It is an object of some embodiments to solve or mitigate at least some of the above or other disadvantages.

According to a first aspect this is achieved by a method of a communication device adapted to process a received signal using either of a first channel selection filter and a second channel selection filter (each having a filter function and a pass band), wherein the received signal comprises signal entities each representing an individually processed block of data.

The method comprises (during use of the first channel selection filter) detecting a presence of an interference signal outside of the pass band of the first channel selection filter and switching to use of the second channel selection filter in response to detecting the presence of the interference signal.

The method also comprises (if the switching occurs at a first point in time within a first signal entity dividing the first signal entity into a first part and a second part) applying a time domain compensation filter to one of the first part and the second part of the first signal entity (the time domain compensation filter having a filter function).

In some embodiments, the first channel selection filter may have a first attenuation outside of the pass band and the second channel selection filter may have a second attenuation outside of the pass band, wherein the second attenuation is higher than the first attenuation.

In some embodiments, a filter order of the second channel selection filter may be higher than a filter order of the first channel selection filter.

According to some embodiments, detecting a presence of an interference signal outside of the pass band of the first channel selection filter comprises detecting a presence of an interference signal in a transition band of the first channel selection filter.

In some embodiments, a power consumption associated with use of the second channel selection filter may be higher than a power consumption associated with use of the first channel selection filter.

The received signal may, for example, comprise an orthogonal frequency division multiplex (OFDM) signal and the signal entities may, for example, be orthogonal frequency division multiplex (OFDM) symbols.

In some embodiments, where each of the first channel selection filter and the second channel selection filter has a transition band, the transition band of the second channel selection filter may be narrower than the transition band of the first channel selection filter.

According to some embodiments, the pass bands of the first and second channel selection filters may coincide (e.g. a cutoff frequency of the first channel selection filter equals a cutoff frequency of the second channel selection filter).

According to some embodiments, a pass band of the time domain compensation filter may coincide with either or both of the pass bands of the first and second channel selection filters (e.g. equal cutoff frequencies).

In some embodiments, the method may further comprise (during use of the second channel selection filter) detecting an absence of the interference signal and switching to use of the first channel selection filter in response to detecting the absence of the interference signal, wherein the switching occurs at a second point in time between two signal entities.

The filter function of the time domain compensation filter may, in some embodiments, approximate a ratio between the filter functions of the first and second channel selection filters. For example, the approximation may apply to one or more of the pass band, the transition band and the stop band of the time domain compensation filter. In some embodiments, a weighting factor (a) may represent a trade-off between the accuracy of the approximation in two or more of the pass band, the transition band and the stop band In some embodiments, the time domain compensation filter may be applied to the second part of the first signal entity and the ratio may comprise the filter function of the first channel selection filter divided by the filter function of the second channel selection filter.

In some embodiments, the time domain compensation filter may be applied to the first part of the first signal entity and the ratio may comprise the filter function of the second channel selection filter divided by the filter function of the first channel selection filter. To this end, the method may further comprise buffering the first signal entity before applying the time domain compensation filter.

In some of the latter embodiments, the method may further comprise applying an initial frequency domain compensation to the first signal entity, wherein the initial frequency domain compensation approximates the filter function of the first channel selection filter divided by the filter function of the second channel selection filter.

The method may, according to some embodiments, further comprise (during use of the second channel selection filter) applying a subsequent frequency domain compensation to one or more signal entities subsequent to the first signal entity.

The one or more signal entities subsequent to the first signal entity may, for example, be previous to a first pilot signal entity following the first signal entity.

In some embodiments, the subsequent frequency domain compensation may approximate the filter function of the first channel selection filter divided by the filter function of the second channel selection filter.

In some embodiments, any frequency domain compensation may comprise adapting coefficients of a channel estimation and/or of an equalization.

The time domain compensation filter may be a digital filter. Any frequency domain compensation may be a digital compensation.

A second aspect is a computer program product comprising a computer readable medium, having thereon a computer program comprising program instructions. The computer program is loadable into a data-processing unit and adapted to cause execution of the method according to the first aspect when the computer program is run by the data-processing unit.

A third aspect is a receiver arrangement of a communication device adapted to process a received signal using either of a first channel selection filter and a second channel selection filter (each having a filter function and a pass band), wherein the received signal comprises signal entities each representing an individually processed block of data.

The receiver arrangement comprises the first channel selection filter, the second channel selection filter, a time domain compensation filter (having a filter function) and a control unit.

The control unit is adapted to (during use of the first channel selection filter) detect a presence of an interference signal outside of the pass band of the first channel selection filter and switch to use of the second channel selection filter in response to detecting the presence of the interference signal.

The control unit is also adapted to (if the switching occurs at a first point in time within a first signal entity dividing the first signal entity into a first part and a second part) cause application of the time domain compensation filter to one of the first part and the second part of the first signal entity.

In some embodiments, the control unit may be further adapted to (during use of the second channel selection filter) detect an absence of the interference signal and switch to use of the first channel selection filter in response to detecting the absence of the interference signal, wherein the switching occurs at a second point in time between two signal entities.

The filter function of the time domain compensation filter may, according to some embodiments, approximate a ratio between the filter functions of the first and second channel selection filters.

In some embodiments, the control unit may be adapted to cause application of the time domain compensation filter to the second part of the first signal entity and the ratio may comprise the filter function of the first channel selection filter divided by the filter function of the second channel selection filter.

In some embodiments, the control unit may be adapted to cause application of the time domain compensation filter to the first part of the first signal entity and the ratio may comprise the filter function of the second channel selection filter divided by the filter function of the first channel selection filter. To this end, the receiver arrangement may further comprise a signal buffer adapted to buffer the first signal entity before application by the control unit of the time domain compensation filter.

In some of these embodiments, the control unit may be further adapted to cause application of an initial frequency domain compensation to the first signal entity, wherein the initial frequency domain compensation approximates the filter function of the first channel selection filter divided by the filter function of the second channel selection filter.

The control unit may, according to some embodiments, be further adapted to (during use of the second channel selection filter) cause application of a subsequent frequency domain compensation to one or more signal entities subsequent to the first signal entity.

A fourth aspect is a communication device comprising the receiver arrangement according to the third aspect.

In some embodiments, the third and fourth aspects may additionally have features identical with or corresponding to any of the various features as explained above for the first aspect.

An advantage of some embodiments is that use of two (or more) different channel selection filters, and switching there between, is enabled while avoiding (or at least reducing) negative impact on the overall performance of the receiver.

Yet an advantage of some embodiments is that power consumption may be reduced.

Another advantage of some embodiments is that switching between channel selection filters may be performed without timing restrictions.

Yet another advantage of some embodiments is that an amount of retransmissions due to switching between channel selection filters may be reduced.

BRIEF DESCRIPTION OF THE DRAWINGS

Further objects, features and advantages will appear from the following detailed description of embodiments, with reference being made to the accompanying drawings, in which.

DETAILED DESCRIPTION

In the following, embodiments will be described where a time domain (digital) compensation filter is applied if a switch between two channel selection filters is performed within a first signal entity of a received signal. In some embodiments, (digital) frequency domain compensation may also be applied to the first signal entity and/or subsequent signal entities.

The description herein will assume application of two channel selection filters, but this is not to be understood as limiting. Contrarily, embodiments may be equally applicable in scenarios with more than two channel selection filters.

Furthermore, it will be assumed (without being considered limiting) that the first channel selection filter has a lower complexity (e.g. filter order) than the second channel selection filter.

In a typical example (e.g. applicable to the Universal Mobile Telecommunication Standard, Long Term Evolution—UMTS-LTE) the first channel selection filter may be a Chebyshev filter of order 2 and the second channel selection filter may be a Chebyshev filter of order 5.

It will also be assumed (without being considered limiting) that the digital processing of the received signal is basically adapted to fit with application of the first channel selection filter, and that (without proper compensation) switching to the second channel selection filter introduces corruption of data. One possible effect of data corruption may be that signal entities (e.g. data packets) may have to be re-transmitted, which typically lowers system performance (e.g. throughput).

In a first example approach to using two channel selection filters, switching between channel selection filters may be limited to occur between signal entities to avoid a situation where different parts of the same signal entity is processed by different channel selection filters. This approach typically has the drawback that, if the low complexity channel selection filter is in use and an interference signal appears during reception of a signal entity, the data of that signal entity will be corrupted by the interference signal.

In a second example approach to using two channel selection filters, switching between channel selection filters may be done as soon as an interference signal is detected, which may result in a situation where different parts of the same signal entity is processed by different channel selection filters. This approach typically has the drawback that the data of that signal entity will be corrupted by the switch of channel selection filter.

Embodiments presented herein allows for switching to a more complex channel selection filter as soon as an interference signal is detected (i.e. without timing restrictions). The data corruption mentioned above is avoided (or at least reduced) by introducing time domain compensation if the switch is performed within a signal entity of a received signal as mentioned above.

Figure 1:
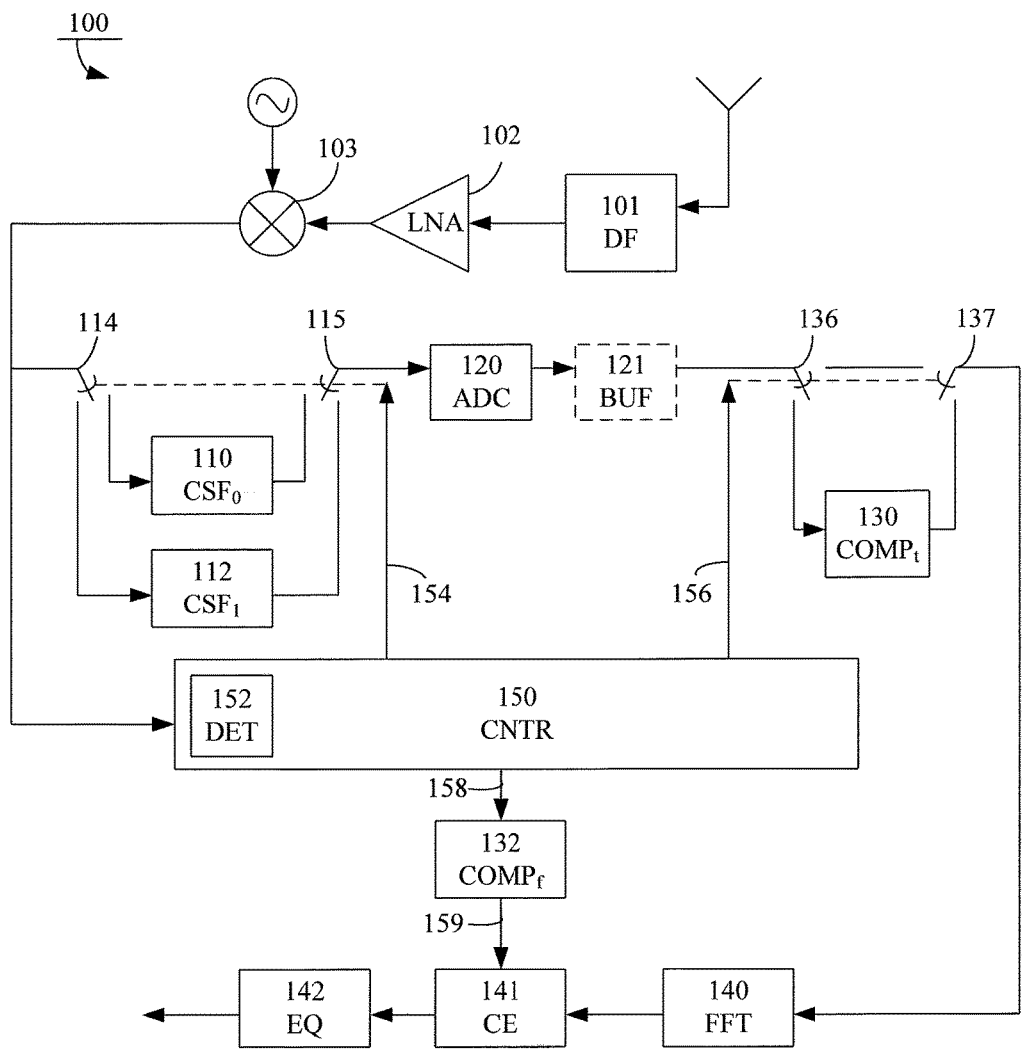
FIG. 1 is a block diagram illustrating an example receiver arrangement according to some embodiments.

FIG. 1 is schematically illustrates an example receiver arrangement 100 according to some embodiments. The receiver arrangement 100 may, for example, be part of a communication device (e.g. a wireless communication device).

A signal received by the receiver arrangement comprises signal entities (e.g. OFDM symbols), each representing an individually processed block of data.

The received signal is first processed according to any suitable analog methods in a receiver front end of the receiver arrangement. In the example of FIG. 1, such methods are represented by a duplex filter (DF) 101, an amplifier (LNA) 102 and a mixer 103.

Before application of an analog-to-digital converter (ADC) 120 to the received signal, the received signal is processed using either of a first channel selection filter ($CSF_0$) 110 and a second channel selection filter ($CSF_1$) 112. The position of the synchronously operated switches 114 and 115 determines which of the first channel selection filter 110 and the second channel selection filter 112 is currently applied. The position of the switches 114 and 115 is controlled by a first control signal 154.

After analog-to-digital conversion, the received signal is processed according to any suitable analog methods in a digital receiver chain. In the example of FIG. 1, such methods are represented by a fast Fourier transform (FFT) 140, a channel estimator (CE) 141 and an equalizer (EQ) 142, which may be suitable if the received signal is an OFDM signal.

The received signal before the channel selection filter is input to a control unit (CNTR) 150. The control unit 150 is adapted to (e.g. by means of an interference signal detector (DET) 152) detect presence and absence of an interference signal outside of (and typically close to) the pass band of the channel selection filters (e.g. in the transition band of the first channel selection filter). The detection may be implemented according to any suitable known or future method.

If presence of an interference signal is detected during use of the first channel selection filter 110, the control unit 150 is adapted to generate a control signal 154 that causes the switches 114 and 115 to change position such that the second channel selection filter is applied. According to typical embodiments, the switch to the second channel selection filter is performed as soon as the interference signal is detected, even if the detection occurs during reception of a signal entity.

It should be noted that switching between use of a first and use of a second channel selection filter can be obtained by other means than those illustrated in FIG. 1. For example, the channel selection filters may be implemented by a number of cascaded filter links (e.g. first and/or second order filter links). Switching between use of channel selection filters may be accomplished by changing the number of filter links in a reconfigurable filter circuit. For example, provided that the second channel selection filter has a higher order than the first channel selection filter, a switch from use of the first channel selection filter to use of the second channel selection filter can be accomplished by switching in additional filter links, in addition to the filter links of the first channel selection filter. Thus, from a hardware implementation perspective, the first channel selection filter and the second channel selection filter may have some hardware components in common.

If absence of the interference signal is detected during use of the second channel selection filter 112, the control unit 150 is adapted to generate a control signal 154 that causes the switches 114 and 115 to change position such that the first channel selection filter is applied. According to some embodiments, the switch to the first channel selection filter is performed between two signal entities.

The receiver arrangement 100 also comprises a time domain compensation filter (COMP) 130. The time domain compensation filter 130 is used to mitigate data corruption that occurs when a switch from the first channel selection filter 110 to the second channel selection filter 112 is performed during reception of a (first) signal entity (dividing the first signal entity into a first part and a second part). The position of the synchronously operated switches 136 and 137 determines whether or not the time domain compensation filter 130 is applied. The position of the switches 136 and 137 is controlled by a second control signal 156.

The functionality illustrated by switches 136, 137 and time domain compensation filter 130 in FIG. 1 may, for example, be implemented in software on a digital signal processor (DSP). In some embodiments, the function of the switches 136, 137 and the time-domain compensation filter 130 may be implemented by a software function that returns either the uncompensated or the compensated signal, in which the switching may be implemented with an if/else-statement or similar. Is such embodiments, the terminology "synchronously operated" might not be applicable.

Generally, it should be noted that FIG. 1 is a functional block diagram, which may be implemented in various alternative ways, for example, by direct mapping to hardware components and/or by programming a digital signal processor (such as a baseband processor).

According to a first example, the time domain compensation filter 130 is applied to the second part of the first signal entity. Then, it is beneficial if the time domain compensation filter 130 has a filter function that (at least approximately) equals the filter function of the first channel selection filter 110 divided by the filter function of the second channel selection filter 112. In this example, the control unit 150 is adapted to generate a control signal 156 that causes the switches 136 and 137 to change position such that the time domain compensation filter is applied during the second part of the first signal entity. In some embodiments, the time domain compensation filter 130 may be applied also for to signal entities subsequent to the first signal entity (e.g. until a pilot signal entity is received—resulting in a new estimation of channel coefficients that are based on application of the second channel selection filter, until a switch to use of the first channel selection filter is made, or until any other suitable moment in time).

According to a second example, the time domain compensation filter 130 is applied to the first part of the first signal entity. Then, it is beneficial if the time domain compensation filter 130 has a filter function that (at least approximately) equals the filter function of the second channel selection filter 110 divided by the filter function of the first channel selection filter 112. In this example, a buffer (BUF) 121 collects the content of the entire first signal entity before application of the time domain compensation filter, and the control unit 150 is adapted to generate a control signal 156 that causes the switches 136 and 137 to change position such that the time domain compensation filter is applied during the first part of the first signal entity.

In the second example, the compensated first signal entity will be (approximately) equivalent to a signal entity entirely processed by the second channel selection filter 112. Since the digital processing of the received signal is basically adapted to fit with application of the first channel selection filter 110, further compensation (to mimic a signal entity entirely processed by the first channel selection filter) is beneficial when continuing to process the first signal entity. This may be achieved by application of frequency domain compensation (COMP) 132 during processing of the first signal entity that (at least approximately) mimics the filter function of the first channel selection filter divided by the filter function of the second channel selection filter. The frequency domain compensation is controlled by a third control signal 158 generated by the control unit 150 and may be manifested as an adaptation of the estimated channel coefficients as indicated by 159 in FIG. 1.

For both the first and second examples above (although typically not for the first example if the time domain compensation filter 130 is applied also for to signal entities subsequent to the first signal entity), the frequency domain compensation 132 may be applied to signal entities subsequent to the first signal entity (e.g. until a pilot signal entity is received—resulting in a new estimation of channel coefficients that are based on application of the second channel selection filter, until a switch to use of the first channel selection filter is made, or until any other suitable moment in time).

In some embodiments, a corresponding frequency domain compensation may be applied to signal entities subsequent to a switch from the second channel selection filter to the first channel selection filter until a pilot signal entity is received. The corresponding frequency domain compensation would, in this case, (at least approximately) mimic the filter function of the second channel selection filter divided by the filter function of the first channel selection filter.

In some embodiments, the time domain compensation filter may be applied (in stead of the frequency compensation) to one or more of the signal entities subsequent to the first signal entity.

Figure 2:
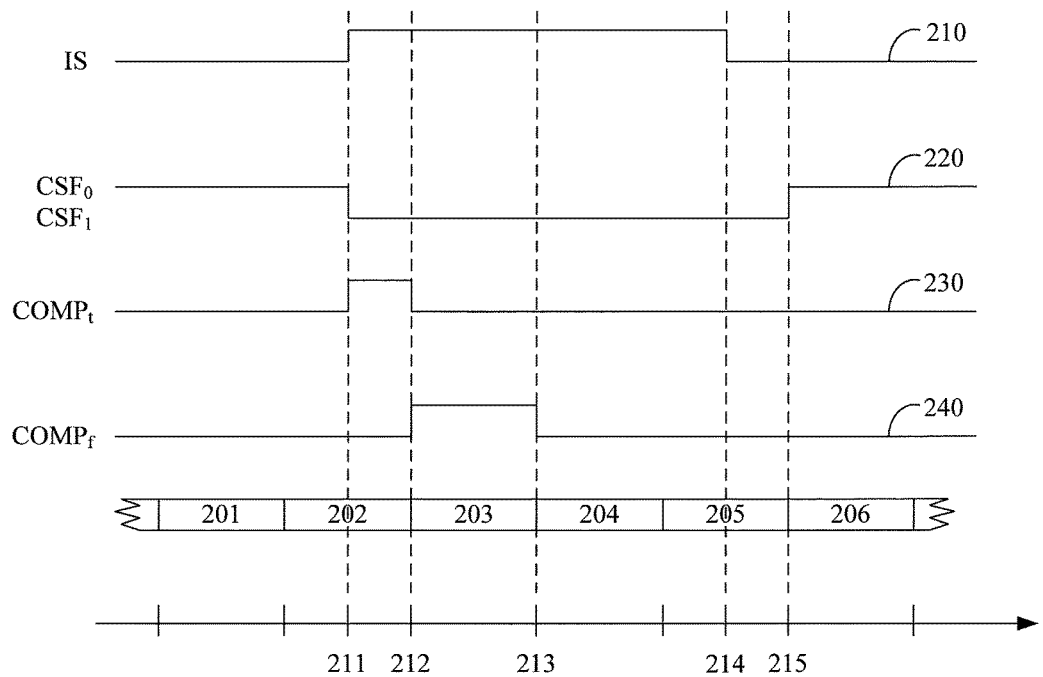
FIG. 2 is a timing diagram illustrating an example compensation approach according to some embodiments.

FIG. 2 is a timing diagram illustrating a compensation approach according to the first example above, and reference is made to the description of FIG. 1. The received signal is illustrated by signal entities 201, 202, 203, 204, 205, and 206.

At time instant 211, an interference signal (IS) is detected as illustrated by the positive flank of the signal indicator 210, and a switch is performed from application of the first channel selection filter ($CSF_0$) to application of the second channel selection filter ($CSF_1$) as illustrated by 220.

Since time instant 211 is in the middle of a signal entity (the first signal entity 202), compensation is needed. In this example, a time domain compensation filter (COMP) is applied to the second part of the first signal entity 202 (i.e. from time instant 211 to time instant 212) as illustrated by 230.

A frequency domain compensation (COMP) is applied to signal entities subsequent to the first signal entity (i.e. from time instant 212) as illustrated by 240. In this example, the signal entity 204 is a pilot signal entity. Hence, the frequency domain compensation is ceased at time instant 213.

Alternatively, time domain compensation filter (COMP) could have been applied from time instant 211 until time instant 213 with no frequency domain compensation (COMP).

At time instant 214, the interference signal disappears as illustrated by the negative flank of the signal indicator 210. Since time instant 214 is in the middle of a signal entity (205), the switch from application of the second channel selection filter ($CSF_1$) to application of the first channel selection filter ($CSF_0$) is performed when the signal entity is received in its entirety (at time instant 215) as illustrated by 220.

Figure 3:
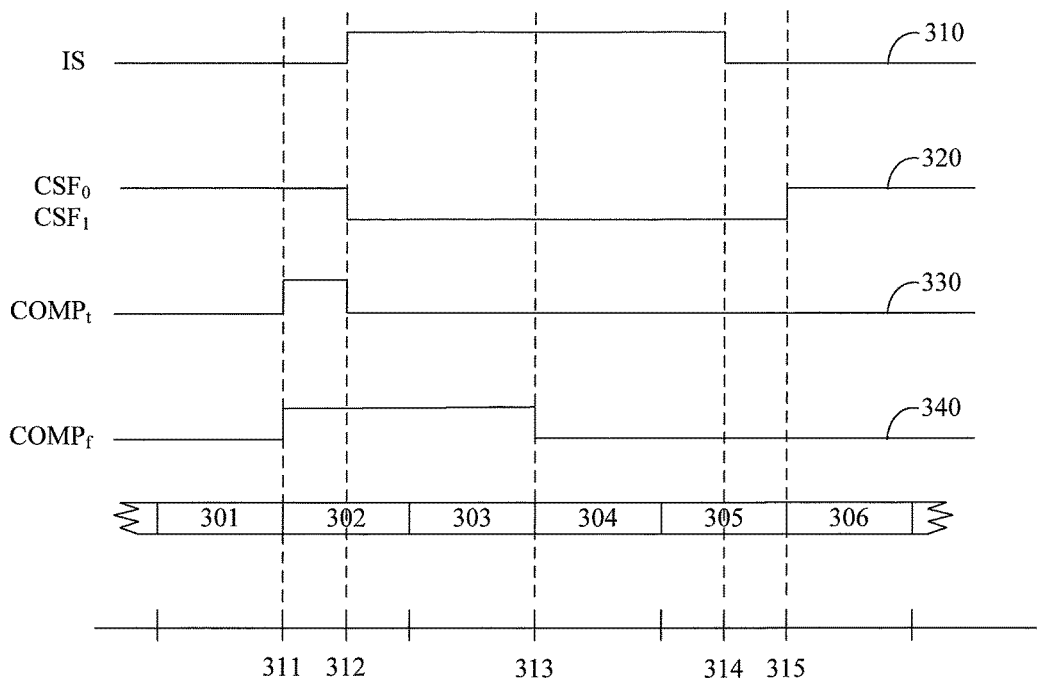
FIG. 3 is a timing diagram illustrating an example compensation approach according to some embodiments.

FIG. 3 is a timing diagram illustrating a compensation approach according to the second example above, and reference is made to the description of FIG. 1. The received signal is illustrated by signal entities 301, 302, 303, 304, 305, and 306.

At time instant 312, an interference signal (IS) is detected as illustrated by the positive flank of the signal indicator 310, and a switch is performed from application of the first channel selection filter ($CSF_0$) to application of the second channel selection filter ($CSF_1$) as illustrated by 320.

Since time instant 312 is in the middle of a signal entity (the first signal entity 302), compensation is needed. In this example, a time domain compensation filter ($COMP_t$) is applied to the first part of the first signal entity 302 (i.e. from time instant 311 to time instant 312) as illustrated by 330. This is enabled by buffering of the received signal before application of the time domain compensation filter.

As explained in connection with FIG. 1, a frequency domain compensation ($COMP_f$) is applied to the first signal entity 302 and to signal entities subsequent to the first signal entity (i.e. from time instant 311) as illustrated by 340. In this example, the signal entity 304 is a pilot signal entity. Hence, the frequency domain compensation is ceased at time instant 313.

At time instant 314, the interference signal disappears as illustrated by the negative flank of the signal indicator 310. Since time instant 314 is in the middle of a signal entity (305), the switch from application of the second channel selection filter ($CSF_1$) to application of the first channel selection filter ($CSF_0$) is performed when the signal entity is received in its entirety (at time instant 315) as illustrated by 320.

It should be noted that the switching between the first and second channel selection filters (e.g. time instants 211, 215, 312 and 315) may involve a short interruption in the channel selection filtering due to a ramp up phase of the newly applied filter. This phase is not shown in FIGS. 2 and 3. In some embodiments, one or more of the time domain compensation and the frequency domain compensation may be adapted to fit the ramp up phase. For example, in a situation as that of FIG. 2, time instant 211, the time domain compensation filter may be applied when the ramp up phase of the second channel selection filter is completed.

Figure 4:
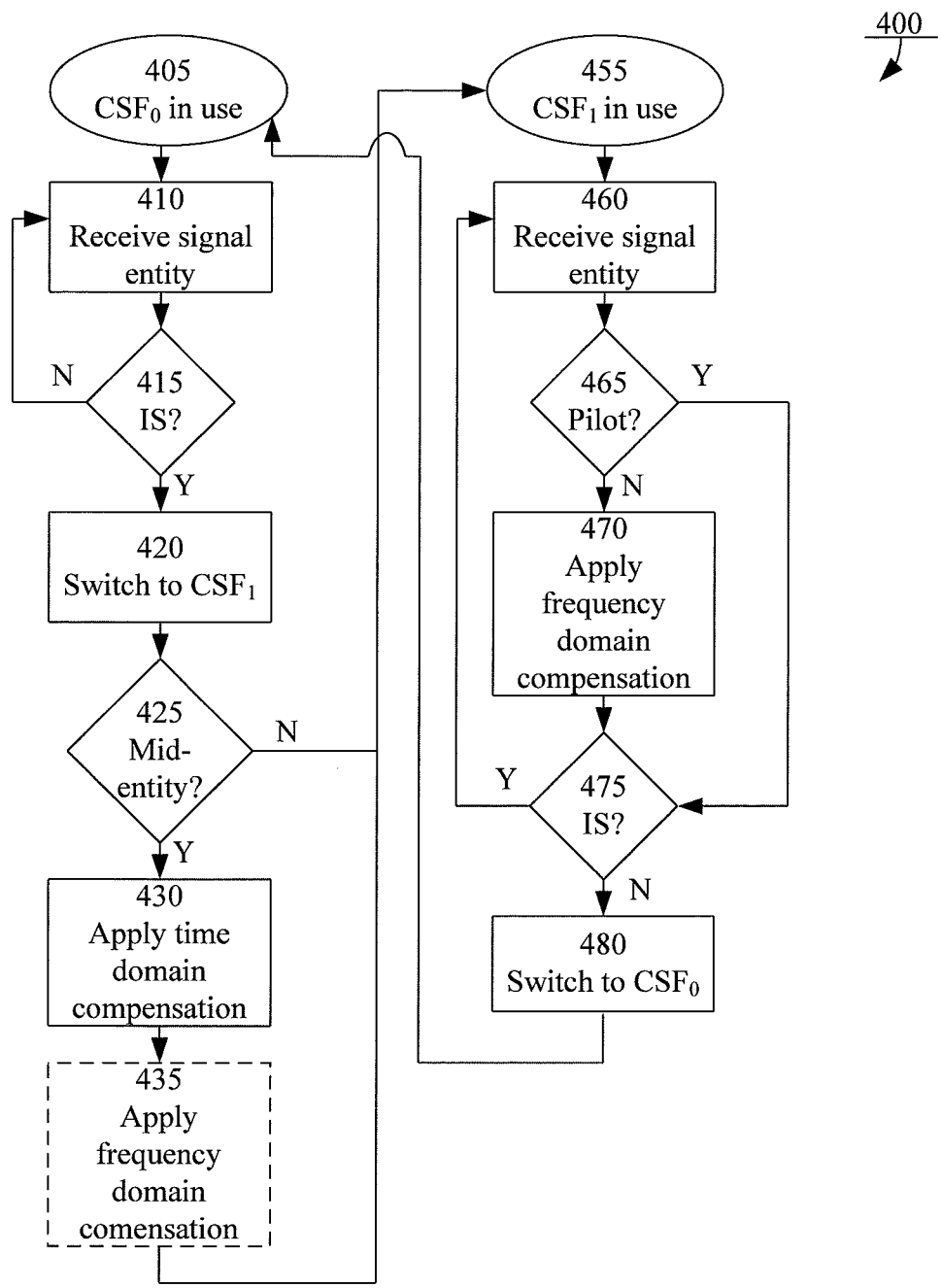
FIG. 4 is a flowchart illustrating example method steps according to some embodiments.

FIG. 4 illustrates an example method 400 according to some embodiments. The method 400 may, for example, be performed by the receiver arrangement 100 of FIG. 1.

The method 400 may be executed in a receiver of a communication device adapted to process a received signal using either of a first channel selection filter ($CSF_0$, mode 405, compare with 110 of FIG. 1) and a second channel selection filter ($CSF_1$, mode 455, compare with 112 of FIG. 1), wherein the received signal comprises signal entities each representing an individually processed block of data.

In step 410, a signal entity is received during use of the first channel selection filter. If there is no interference signal (IS) detected (N-path out from step 415) the signal entity is processed without adaptations of the process and the method returns to step 410 to receive the next signal entity.

If an interference signal (IS) is detected (Y-path out from step 415), a switch to use of the second channel selection filter is performed in step 420. If the switching of step 420 occurs between received entities (N-path out from step 425) the signal entity is processed without adaptations of the process and the method proceeds to step 460 under mode 455 to receive the next signal entity.

If the switching of step 420 does not occur between received entities (denoted here as mid-entity, Y-path out from step 425) the signal entity is processed with a time domain compensation filter being applied to a relevant part of the signal entity in step 430 (possibly, a frequency domain compensation is also applied to the entire signal entity in step 435) before the method proceeds to step 460 under mode 455 to receive the next signal entity.

In step 460, a signal entity is received during use of the second channel selection filter. If no pilot signal entity has been received since the switch to using the second channel selection filter (N-path out from step 465) the signal entity is processed with a frequency domain compensation being applied to the entire signal entity in step 470 and the method proceeds to step 475 where presence of interference signals is monitored. If a pilot signal entity has been received since the switch to using the second channel selection filter (Y-path out from step 465) the signal entity is processed without adaptations of the process and the method proceeds to step 475.

If there is an interference signal (IS, Y-path out from step 475) the method returns to step 460 to receive the next signal entity.

If there is no interference signal (IS, N-path out from step 475), a switch to use of the first channel selection filter is performed (between signal entities) in step 480 and the method proceeds to step 410 under mode 405 to receive the next signal entity.

For details of steps 430, 435 and 470, reference is made to the description in relation to FIGS. 1, 2 and 3.

Example designs for the time domain compensation filter and for the frequency domain compensation will now be given.

The purpose of the time domain compensation filter (COMP) is to limit the effect of switching between channel selection filters. The time domain compensation filter acts like an equalizer (equalizer filter) in time for the difference caused by a channel selection filter switch. Two examples for the use of the time domain compensation filter have been elaborated on above.

In the first example, the time domain compensation filter is applied on the second part of the signal entity where the switch occurs. A possible implementation of the time domain compensation filter in this example is $COMP_t = CSF_0/CSF_1$, whereby the time domain compensation filter eliminates the effect of $CSF_1$ and the subsequent baseband processing will perceive the data to be unaffected by $CSF_1$.

Typically, designing the time domain compensation filter to satisfy $COMP_t = CSF_0/CSF_1$ exactly may be cumbersome (if not impossible), and an approximate solution may be selected. Such an approximate solution may, for example, attempt to very closely model the optimal filter function in the pass band.

Figure 5:
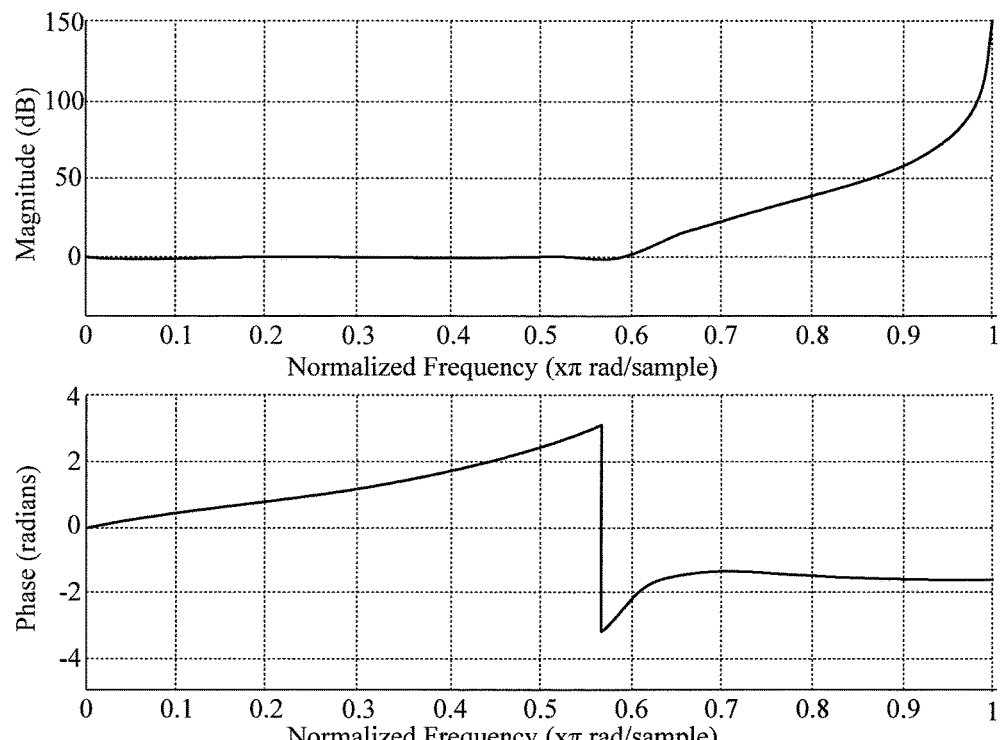
FIG. 5 is a plot illustrating an example filter function according to some embodiments.

FIG. 5 shows magnitude and phase of an example filter function approximating $COMP_t = CSF_0/CSF_1$ when $CSF_0$ and $CSF_1$ are Chebyshev filters of order 2 and 5, respectively. The cutoff frequency has been chosen to 0.59 to correspond to 20 MHz of UMTS-LTE (18 MHz of subcarrier data out of 30.72 MHz bandwidth).

A problem with this approach is that higher frequencies (above the cut-off frequency) will typically be digitally amplified. To solve that problem, a significant increase of complexity in the subsequent baseband processing blocks may be necessary.

In the second example, the time domain compensation filter is applied (after buffering, which may already be present in the architecture) on the first part of the signal entity where the switch occurs. A possible implementation of the time domain compensation filter in this example is $COMP_t=CSF_1/CSF_0$, whereby the time domain compensation filter eliminates the effect of $CSF_0$ and the subsequent baseband processing will perceive the data to be unaffected by $CSF_0$. Hence, further compensation (frequency domain compensation as elaborated on above) may be needed depending on the implementation.

Typically, designing the time domain compensation filter to satisfy $COMP_t=CSF_1/CSF_0$ exactly may be cumbersome (if not impossible), and an approximate solution may be selected. Such an approximate solution may, for example, attempt to very closely model the optimal filter function in the pass band. Derivation of an approximation of $COMP_t=CSF_1/CSF_0$ will now be outlined. A similar approach may be applied to an approximation of $COMP_t=CSF_0/CSF_1$.

In this derivation, designing an ideal equalizer filter will not be aimed at. Instead, the aim will be to find a filter function which is as good as close as possible to the ideal filter function $COMP_t=CSF_1/CSF_0$ in the frequency region where the data is located and relax the requirements outside of the cut-off frequency. Preferably, the frequencies outside the cut-off frequency ($w_0$) should not be amplified and the magnitude and phase should follow the ideal filter function from zero frequency to the cut-off frequency. The target for this optimization problem is to minimize the following function:

$$\alpha \int_0^{w_0} |h(w)-h_{id}(w)|^2 dw + (1-\alpha)\int_{w_0}^{1} |h(w)|^2 dw,$$

where $h(w)$ is the desired filter function in the frequency domain, e.g. a FIR filter with filter length n−1 and filter coefficients $a_k$:

$$h(w)=\Sigma_{k=0}^{n-1} a_k e^{j2\pi kw},$$

$h_{id}(w)$ is the ideal filter function in the frequency domain, and $\alpha$ is a weighting factor to trade off correspondence with the ideal filter function in the pass band and attenuation outside the cut-off frequency.

After taking the derivative, the minimization problem may be written as:

$$\alpha(a^H B_{0,w_0}{}^T - f^*_{0,w_0}{}^T) + (1-\alpha) a^H B_{w_0,1}{}^T = 0,$$

which gives the filter coefficient vector a (a vector with the filter coefficients $a_k$ as elements):

$$a = \left(B^*_{0,w_0} + \frac{1-\alpha}{\alpha} B^*_{w_0,1}\right)^{-1} f^*_{0,w_0},$$

where the superscript * denotes complex conjugate, the superscript H denotes Hermitian transposition, the superscript T denotes transposition, $f_{a,b}=\int_a^b eh^*_{id}(w)dw$, $B_{a,b}=\int_a^b ee^H dw$, $e=(e^{-j2\pi wt_0} e^{-j2\pi wt_1} \ldots e^{-j2\pi wt_{n-1}})^T$, and $t_i$, i=0, 1, ..., n−1 denotes sample times.

The derivation has been presented for positive frequencies only, but a similar derivation is applicable for both positive and negative frequencies, which results in the following expression:

$$a = \left(B^*_{-w_0,w_0} + \frac{1-\alpha}{\alpha}(B_{-1,-w_0} + B_{w_0,1})^*\right)^{-1} f^*_{-w_0,w_0}.$$

Figure 6:
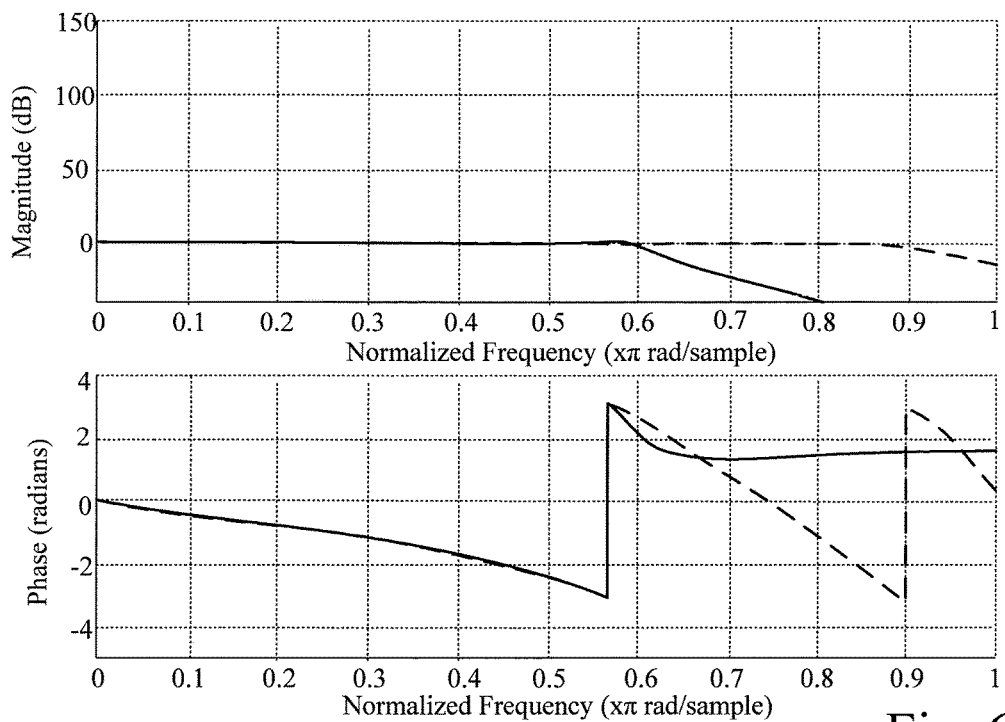
FIG. 6 is a plot illustrating example filter functions according to some embodiments.

FIG. 6 shows magnitude and phase of an example filter function (dashed lines) approximating $COMP_t=CSF_1/CSF_0$ when $CSF_0$ and $CSF_1$ are Chebyshev filters of order 2 and 5, respectively. The ideal filter function (solid lines) is also shown for reference. The cutoff frequency has been chosen to 0.59 to correspond to 20 MHz of UMTS-LTE (18 MHz of subcarrier data out of 30.72 MHz bandwidth).

The appreciative filter function of FIG. 6 has been derived according to the method above using $\alpha=0.9991$ and a filter length of n−1=10. These values were chosen to provide a reasonable trade off between complexity and performance. The amplification outside the cut off frequency is below 0.32 dB and the maximum deviation from the ideal filter in the pass band is below 1 dB.

Some performance parameters for application of the above exemplified approaches will now be given with reference to FIGS. 7 and 8.

Figure 7:
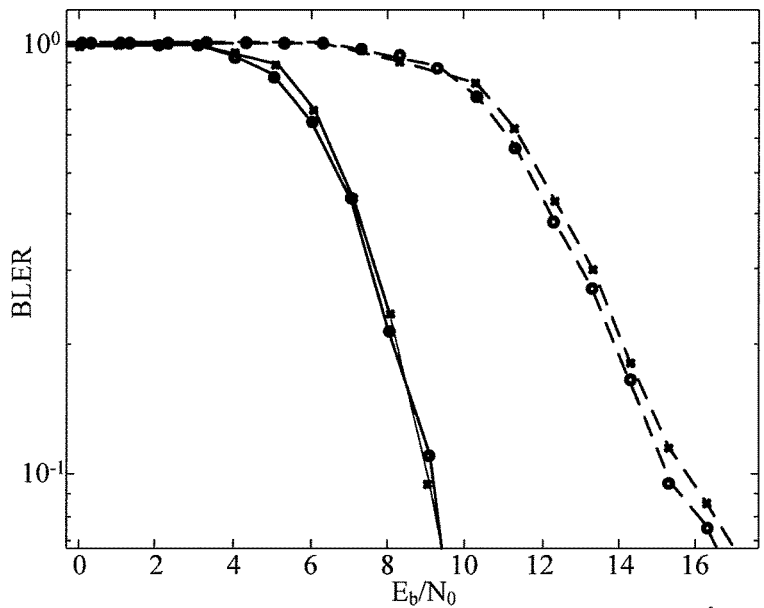
FIG. 7 is a plot illustrating performance degradation according to some example scenarios.

A realistic duration of the ramp up phase is 1 µs, which corresponds to approximately 1.5% of one OFDM symbol in UMTS-LTE, and FIG. 7 illustrates performance degradation due to the ramp up phase in relation to channel selection filter switching for such an example. FIG. 7 shows the result of simulations (using the simulation channel 3GPP EVA 5 Hz) with two different settings (dashed and solid lines) of modulation and code rate, 6 iterations in the Turbo decoder and full resource block allocation for PDSCH. The plots marked with circles do not contain any distortion due to ramp up, and the plots marked with crosses contain distortion corresponding to 1 µs ramp up in each sub-frame. It may be concluded that the degradation due to the ramp up phase of the channel selection filters is very limited. Thus, this degradation does not necessarily need to be explicitly compensated for.

Figure 8:
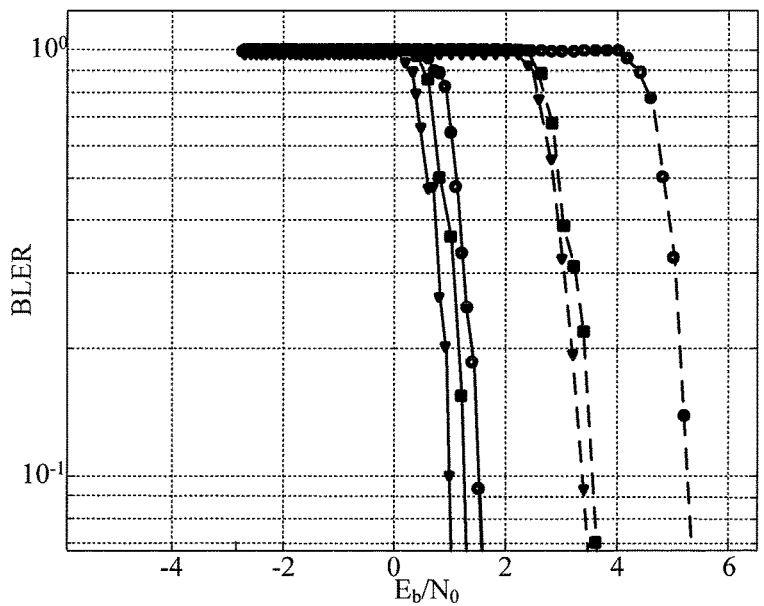
FIG. 8 is a plot illustrating example block error rates achieved by application of some embodiments.

FIG. 8 illustrate performance when applying the approximate time domain compensation filter illustrated in FIG. 6. All simulations of FIG. 8 are performed on PDSCH data with QPSK modulation and with an EVA 5 Hz channel model with full allocation and 6 iterations of Turbo decoding. A switch to the second channel selection filter is done in each sub-frame and the purpose of the simulations is, thus, to show the performance degradation in relation to one single sub-frame. This indicates the probability of a re-transmission for a sub-frame containing a channel selection filter switch. Solid lines show results for code rate 0.5 and dashed lines show results for code rate 0.3. Plots marked with triangles are reference plots (no CSF switch), plots marked with circles show results when only frequency domain compensation is applied, and plots marked with squares show results when both time and frequency domain compensation is applied.

Thus, a reduction in the power consumption by the channel selection filter(s) may be accomplished by switching between two channel selection filters with different complexity (filter order) based on, for example, presence or absence of an interference signal in the transition band of the channel selection filter(s). Performance loss due to the switching is mitigated by introducing digital compensation as has been explained and exemplified herein.

The described embodiments and their equivalents may be realized in software or hardware or a combination thereof. All such forms are contemplated to be within the scope of this disclosure.

Embodiments may appear within an electronic apparatus (such as a wireless communication device) comprising circuitry/logic or performing methods according to any of the embodiments.

Figure 9:
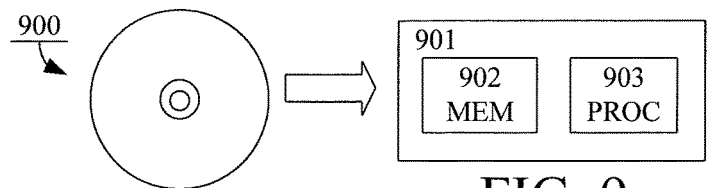
FIG. 9 is a schematic drawing illustrating a computer readable medium according to some embodiments.

According to some embodiments, a computer program product comprises a computer readable medium such as, for example, a CD-ROM as illustrated by 900 in FIG. 9. The computer readable medium may have stored thereon a computer program comprising program instructions. The computer program may be loadable into a data-processing unit (PROC) 903, which may, for example, be comprised in a wireless communication device 901. When loaded into the data-processing unit, the computer program may be stored in a memory (MEM) 902 associated with, or integral to, the data-processing unit. According to some embodiments, the computer program may, when loaded into and run by the data-processing unit, cause the data-processing unit to execute method steps according to, for example, the method shown in FIG. 3.

Reference has been made herein to various embodiments. However, a person skilled in the art would recognize numerous variations to the described embodiments that would still fall within the scope of the claims. For example, the method embodiments described herein describes example methods through method steps being performed in a certain order. However, it is recognized that these sequences of events may take place in another order without departing from the scope of the claims. Furthermore, some method steps may be performed in parallel even though they have been described as being performed in sequence.

In the same manner, it should be noted that in the description of embodiments, the partition of functional blocks into particular units is by no means limiting. Contrarily, these partitions are merely examples. Functional blocks described herein as one unit may be split into two or more units. In the same manner, functional blocks that are described herein as being implemented as two or more units may be implemented as a single unit without departing from the scope of the claims.

Hence, it should be understood that the details of the described embodiments are merely for illustrative purpose and by no means limiting. Instead, all variations that fall within the range of the claims are intended to be embraced therein.

The invention claimed is:

1. A method of a communication device adapted to process a received signal using either of a first channel selection filter and a second channel selection filter, each channel selection filter having a respective filter function and a respective pass band, the received signal comprising signal entities each representing an individually processed block of data, the method comprising:
during use of the first channel selection filter, detecting a presence of an interference signal outside of the pass band of the first channel selection filter;
switching to use of the second channel selection filter in response to detecting the presence of the interference signal; and
if the switching occurs at a first point in time within a first signal entity dividing the first signal entity into a first part and a second part, applying a time domain compensation filter to one of the first part and the second part of the first signal entity, the time domain compensation filter having a filter function.

2. The method of claim 1:
wherein each of the first channel selection filter and the second channel selection filter has a respective transition band; and
wherein the transition band of the second channel selection filter is narrower than the transition band of the first channel selection filter.

3. The method of claim 1, further comprising:
during use of the second channel selection filter, detecting an absence of the interference signal; and
switching to use of the first channel selection filter in response to detecting the absence of the interference signal, wherein the switching occurs at a second point in time between two signal entities.

4. The method of claim 1, wherein the filter function of the time domain compensation filter approximates a ratio between the filter functions of the first and second channel selection filters.

5. The method of claim 4:
wherein the time domain compensation filter is applied to the second part of the first signal entity; and
wherein the ratio comprises the filter function of the first channel selection filter divided by the filter function of the second channel selection filter.

6. The method of claim 4:
wherein the time domain compensation filter is applied to the first part of the first signal entity; and
wherein the ratio comprises the filter function of the second channel selection filter divided by the filter function of the first channel selection filter.

7. The method of claim 6:
further comprising applying an initial frequency domain compensation to the first signal entity; and
wherein the initial frequency domain compensation approximates the filter function of the first channel selection filter divided by the filter function of the second channel selection filter.

8. The method of claim 6, further comprising buffering the first signal entity before applying the time domain compensation filter.

9. The method of claim 1, further comprising, during use of the second channel selection filter, applying a subsequent frequency domain compensation to one or more signal entities subsequent to the first signal entity.

10. The method of claim 9, wherein the one or more signal entities subsequent to the first signal entity are previous to a first pilot signal entity following the first signal entity.

11. The method of claim 9, wherein the subsequent frequency domain compensation approximates the filter function of the first channel selection filter divided by the filter function of the second channel selection filter.

12. A non-transitory computer readable recording medium storing a computer program product for controlling a communication device adapted to process a received signal using either of a first channel selection filter and a second channel selection filter, each channel selection filter having a filter function and a pass band, the received signal comprising signal entities each representing an individually processed block of data, the computer program product comprising software instructions which, when run on processing circuitry of the communication device, causes the communication device to:
during use of the first channel selection filter, detect a presence of an interference signal outside of the pass band of the first channel selection filter;
switch to use of the second channel selection filter in response to detecting the presence of the interference signal; and
if the switching occurs at a first point in time within a first signal entity dividing the first signal entity into a first part and a second part, apply a time domain compensation filter to one of the first part and the second part of the first signal entity, the time domain compensation filter having a filter function.

13. A receiver arrangement of a communication device adapted to process a received signal using either of a first channel selection filter and a second channel selection filter, each channel selection filter having a respective filter function and a respective pass band, the received signal comprising signal entities each representing an individually processed block of data, the receiver arrangement comprising:

the first channel selection filter;
the second channel selection filter;
a time domain compensation filter having a filter function; and
a control circuit configured to:
during use of the first channel selection filter, detect a presence of an interference signal outside of the pass band of the first channel selection filter;
switch to use of the second channel selection filter in response to detecting the presence of the interference signal; and
if the switching occurs at a first point in time within a first signal entity dividing the first signal entity into a first part and a second part, cause application of the time domain compensation filter to one of the first part and the second part of the first signal entity.

14. The receiver arrangement of claim 13:
wherein each of the first channel selection filter and the second channel selection filter has a respective transition band; and
wherein the transition band of the second channel selection filter is narrower than the transition band of the first channel selection filter.

15. The receiver arrangement of claim 13, wherein the control circuit is further configured to:
during use of the second channel selection filter, detect an absence of the interference signal; and
switch to use of the first channel selection filter in response to detecting the absence of the interference signal, wherein the switching occurs at a second point in time between two signal entities.

16. The receiver arrangement of claim 13, wherein the filter function of the time domain compensation filter approximates a ratio between the filter functions of the first and second channel selection filters.

17. The receiver arrangement of claim 16:
wherein the control circuit is configured to cause application of the time domain compensation filter to the second part of the first signal entity; and
wherein the ratio comprises the filter function of the first channel selection filter divided by the filter function of the second channel selection filter.

18. The receiver arrangement of claim 16:
wherein the control circuit is configured to cause application of the time domain compensation filter to the first part of the first signal entity; and
wherein the ratio comprises the filter function of the second channel selection filter divided by the filter function of the first channel selection filter.

19. The receiver arrangement of claim 18:
wherein the control circuit is further configured to cause application of an initial frequency domain compensation to the first signal entity; and
wherein the initial frequency domain compensation approximates the filter function of the first channel selection filter divided by the filter function of the second channel selection filter.

20. The receiver arrangement of claim 18, wherein the receiver arrangement further comprises a signal buffer configured to buffer the first signal entity before application by the control circuit of the time domain compensation filter.

21. The receiver arrangement of claim 13, wherein the control circuit is further configured to, during use of the second channel selection filter, cause application of a subsequent frequency domain compensation to one or more signal entities subsequent to the first signal entity.

22. The receiver arrangement of claim 21, wherein the one or more signal entities subsequent to the first signal entity are previous to a first pilot signal entity following the first signal entity.

23. The receiver arrangement of claim 21, wherein the subsequent frequency domain compensation approximates the filter function of the first channel selection filter divided by the filter function of the second channel selection filter.

24. A communication device, comprising
a receiver arrangement adapted to process a received signal using either of a first channel selection filter and a second channel selection filter, each channel selection filter having a respective filter function and a respective pass band, the received signal comprising signal entities each representing an individually processed block of data, the receiver arrangement comprising:
the first channel selection filter;
the second channel selection filter;
a time domain compensation filter having a filter function; and
a control circuit configured to:
during use of the first channel selection filter, detect a presence of an interference signal outside of the pass band of the first channel selection filter;
switch to use of the second channel selection filter in response to detecting the presence of the interference signal; and
if the switching occurs at a first point in time within a first signal entity dividing the first signal entity into a first part and a second part, cause application of the time domain compensation filter to one of the first part and the second part of the first signal entity.

* * * * *